United States Patent
De Foucauld et al.

(10) Patent No.: US 9,935,798 B2
(45) Date of Patent: Apr. 3, 2018

(54) AUTOMATIC IMPEDANCE MATCHING FOR A RADIOFREQUENCY RECEPTION CHAIN

(71) Applicant: COMMISSARIAT A L'ENERGIE ATOMIQUE ET AUX ENERGIES ALTERNATIVES, Paris (FR)

(72) Inventors: Emeric De Foucauld, Coublevie (FR); Thierry Taris, Talence (FR)

(73) Assignee: Commissariat a l'Energie Atomique at aux Energies Alternatives, Paris (FR)

( * ) Notice: Subject to any disclaimer, the term of this patent is extended or adjusted under 35 U.S.C. 154(b) by 0 days.

(21) Appl. No.: 15/379,323

(22) Filed: Dec. 14, 2016

(65) Prior Publication Data

US 2017/0180167 A1 Jun. 22, 2017

(30) Foreign Application Priority Data

Dec. 17, 2015 (FR) .................... 15 62673

(51) Int. Cl.
*H04L 25/12* (2006.01)
*H04L 5/00* (2006.01)
(Continued)

(52) U.S. Cl.
CPC ............. *H04L 25/12* (2013.01); *H03H 7/40* (2013.01); *H03H 11/30* (2013.01); *H04L 5/006* (2013.01);
(Continued)

(58) Field of Classification Search
CPC . H04L 25/12; H04L 25/0278; H04L 25/0264; H04L 25/03; H04L 5/006; H04W 52/52
(Continued)

(56) References Cited

U.S. PATENT DOCUMENTS 4,375,051 A 2/1983 Theall
2008/0055016 A1* 3/2008 Morris, III ............... H03H 7/38
                                                           333/129
(Continued)

FOREIGN PATENT DOCUMENTS

EP  2 037 576 A2  3/2009
EP  2 509 222 A1  10/2012
(Continued)

OTHER PUBLICATIONS

Owen Casha et al., "Utilization of MEMS Tunable Inductors in the design of RF voltage-controlled oscillators," 15th IEEE International Conference on Electronics, Circuits and Systems, 2008, ICECS, pp. 718-721.
(Continued)

*Primary Examiner* — Siu Lee
(74) *Attorney, Agent, or Firm* — Baker Hostetler LLP

(57) ABSTRACT

An automatic impedance-matching method for a radiofrequency reception chain, which includes an antenna, an amplifier and a configurable impedance-matching network, arranged between the antenna and an input of the amplifier. The method includes two steps: acquiring measurement of a gain of the reception chain and of a noise level at an output of the amplifier and tuning the impedance-matching network according to the measurements. A radiofrequency reception chain allowing the method to be implemented is also provided.

8 Claims, 7 Drawing Sheets

(51) Int. Cl.
*H04W 52/52* (2009.01)
*H03H 7/40* (2006.01)
*H03H 11/30* (2006.01)
*H04B 1/10* (2006.01)
*H04B 1/12* (2006.01)
*H04B 1/18* (2006.01)

(52) U.S. Cl.
CPC ............ *H04W 52/52* (2013.01); *H04B 1/1027* (2013.01); *H04B 1/123* (2013.01); *H04B 1/18* (2013.01)

(58) Field of Classification Search
USPC .................................. 375/316, 346, 348
See application file for complete search history.

(56) References Cited

U.S. PATENT DOCUMENTS

2008/0129610 A1    6/2008  Tsfati et al.
2009/0130991 A1    5/2009  Rofougaran et al.
2012/0171970 A1*   7/2012  Muhammad ........ H04L 25/0278
                                                   455/84

FOREIGN PATENT DOCUMENTS

EP        2 509 227 A1    10/2012
JP        2013-070143 A    4/2013
WO        2011/026858 A1   3/2011

OTHER PUBLICATIONS

L. Collot et al., "Reconfigurable Filtering Differential Low Noise Amplifier Using MEMS Tunable Inductor," Proceedings of the 40th European Microwave Conference, Sep. 28-30, 2010, pp. 826-829.

* cited by examiner

AUTOMATIC IMPEDANCE MATCHING FOR A RADIOFREQUENCY RECEPTION CHAIN

CROSS-REFERENCE TO RELATED APPLICATION

This application claims priority to foreign French patent application No. FR 1562673, filed on Dec. 17, 2015, the disclosure of which is incorporated by reference in its entirety.

FIELD OF THE INVENTION

The invention pertains to an automatic impedance-matching method for a radiofrequency reception chain, and, more specifically, to an automatic antenna matching method. The invention also pertains to a radiofrequency reception chain allowing such a method to be implemented.

BACKGROUND

In some radio-frequency information transmission applications, it has been found that the transmission or reception antenna could have an impedance that is highly dependent on external conditions, and notably dependent on the environment in which the antenna is placed.

By way of example, in medical telemetry, there may be cause to introduce the antenna into a probe placed in the human body, and the impedance is then highly dependent on the biological environment that contains the antenna. It depends on the electrical properties (conductivity, dielectric constant) of the surrounding tissues (muscles, fat) or of the liquid environment (blood, other liquids) in which the antenna may be immersed.

Even in more conventional radio-frequency transmission applications (mobile telephony, etc.), the impedance of the antenna may vary.

In a general manner, antenna impedance variations are particularly sensitive for antennas of very small dimensions having a high quality coefficient, which are used in applications with high miniaturization constraints.

These impedance variations may cause losses called mismatch losses: these losses result from the fact that the transmission chain that feeds the antenna, or the reception chain that receives a signal from the antenna, is generally designed to have optimum performance levels when it is loaded (at the output for the transmission chain or at the input for the reception chain) with a quite specific nominal impedance; it has degraded performance levels when it is loaded with an impedance that is different from its nominal value. Mismatch losses can be as much as 40 dB.

For this reason, it is known practice to interpose, between the output of a power amplifier and the antenna of a transmission chain, an impedance-matching network that prompts the transmission chain to see a different impedance from that of the antenna and one that is preferably equal to the nominal value for which it has been designed, for example 100 ohms or 500 ohms. The matching network is tunable, i.e. the values of its capacitive and/or inductive elements are adjustable so as to take the environmental conditions of the antenna into account in order to perform the best possible matching whatever the circumstances. Likewise, it is known practice to interpose such an impedance-matching network between the antenna of a reception chain and the input of a low-noise amplifier.

Several techniques have been proposed for automatically tuning such a matching network, so as to keep up with, by way of example, variations in the antenna impedance that are caused by outside conditions.

The document U.S. Pat. No. 4,375,051 teaches the use, in a transmission chain, of a bidirectional coupler for detecting a mismatch by measuring the fraction of the power provided by an amplifier that is reflected by the antenna. This measurement serves to control the impedance network in order to modify its configuration in a way that tends to reduce the reflected power. This method suffers from two disadvantages: firstly, the reflected power may be low and subject to parasitic interference, because any interference picked up by the antenna comes to distort the measurement owing to the fact that it is added to the reflected power. Secondly, there is no one-to-one relationship between the quantity of reflected power, which serves as an input for the feedback control, and the complex impedance value with which the matching network would need to be provided in order to really match the amplifier to the antenna. This method therefore leads to a new impedance that is not necessarily optimum, because a plurality of pairs of complex impedances correspond to a given power.

Document US 2009/0130991 discloses a method for adjusting the values of the reactances of an impedance-matching circuit that is arranged between a reception antenna and a low-noise amplifier in which the reactances of the elements of said matching circuit are iteratively adjusted so as to maximize the intensity of the signal output from said low-noise amplifier. The convergence of the iterative optimization algorithm may be very slow.

The documents EP 2 037 576, WO2011/026858, EP 2 509 222 and EP 2 509 227 describe various variants of an automatic impedance-matching method for a radio-frequency transmission or reception chain, in which current and voltage measurements at the input (for a transmission chain) or at the output (for a reception chain) of the matching network allow the antenna impedance to be determined. The knowledge obtained in this manner about the antenna impedance allows conventional techniques, for example based on a Smith chart, to be used to adjust the impedance values of the elements of the matching network so as to achieve impedance matching.

These techniques operate well in transmission, but applying them to reception chains is much trickier. Specifically, the power of the signal output by the antenna is very low, and it is difficult to drain off a portion of it in order to take the measurements that make impedance matching possible; in the best case, this requires the use of high-precision detection circuits, which are very complex and expensive. To overcome this drawback, it has been proposed for the current and voltage measurements to be taken at the output of the antenna amplifier (low-noise amplifier, or LNA). However, this is not always possible since certain LNAs are designed in such a way as to have an output impedance that is substantially independent of their input impedance: in this case, measurements taken at the output of the amplifier do not allow the antenna impedance to be determined. Proceeding in a dichotomic manner has also been proposed, by regulating the matching circuit so as to maximize the power output by the LNA without measuring the antenna impedance beforehand. This solution is not satisfactory since, in the absence of special precautions, maximizing the output power may result in a very high noise level, which is not acceptable.

The documents US 2008/129610 and JP 2013/070143 disclose automatic matching techniques that allow both the gain and the noise level to be optimized. These methods proceed by trial and error; they are therefore relatively slow, and the operation of the reception chain is heavily disrupted for the duration of the matching phase.

SUMMARY OF THE INVENTION

The invention aims to provide an automatic impedance-matching technique for a radiofrequency reception chain allowing the aforementioned drawbacks of the prior art to be overcome.

According to the invention, this aim is achieved by tuning the matching network according to the gain of the reception chain and the noise level—expressed, for example, by the signal-to-noise ratio (SNR)—measured at the output of the LNA. More particularly, these two measurements make it possible to determine the antenna impedance and thus to perform impedance matching directly.

One subject of the invention is therefore an automatic impedance-matching method for a radiofrequency reception chain comprising: an antenna, an amplifier and a configurable impedance-matching network arranged between said antenna and an input of said amplifier, the method comprising the following steps:
  a) acquiring at least one measurement of the gain of the reception chain and of the noise level at the output of the amplifier; and
  b) tuning said matching network according to said measurements;
  characterized in that said step b) comprises the following sub-steps:
   b1) determining an impedance seen from the input of the amplifier on the basis of the measurements of step a);
   b2) calculating an impedance of the antenna on the basis of the impedance determined in the preceding sub-step and of the transfer function of the impedance-matching network; and
   b3) tuning said matching network so as to perform impedance matching between the antenna and the amplifier.

Another subject of the invention is a radiofrequency reception chain comprising: an antenna, an amplifier and a configurable impedance-matching network arranged between said antenna and an input of said amplifier, characterized in that it also comprises: circuits for measuring the gain of the reception chain and the noise level at the output of the amplifier; a device for tuning said impedance-matching network; and a data processor configured to receive, as input, gain and noise-level measurements originating from said measuring circuits and to deliver, as output, signals for controlling said tuning device; characterized in that said data processor is configured to: determine an impedance seen from the input of the amplifier on the basis of the measurements originating from said measuring circuits; calculate an impedance of the antenna on the basis of the impedance thus determined and of the transfer function of the impedance-matching network; and deliver, as output, signals for controlling said tuning device, which signals are capable of performing impedance matching between the antenna and the amplifier. More particularly, said data processor may be configured to determine said impedance seen from the input of the amplifier through application of a lookup table.

BRIEF DESCRIPTION OF THE DRAWINGS

Other features, details and advantages of the invention will become apparent on reading the description, which is given with reference to the appended drawings, which are given by way of example and show, respectively.

DETAILED DESCRIPTION

The term "radiofrequency" is understood to mean any frequency between 3 kHz and 300 GHz.

The term "low-noise amplifier" is understood to mean an amplifier whose input is connected, or intended to be connected, either directly or indirectly, to a receiving antenna.

The term "reactive element" is understood to mean an electrical component whose impedance has, at at least one frequency in the radiofrequency domain, a reactive (capacitive or inductive) component that is greater than or equal to—and preferably greater, by a factor 10 or more, than—its resistive component.

Throughout the rest of the text, the signals in the matching network will be considered to have a single frequency $f=\omega/2\pi$, thereby allowing a capacitive or inductive element (reactive element) to be characterized by a reactance value. This approximation is generally satisfactory in the radiofrequency domain.

The term "impedance matching" is understood to mean a condition under which the transfer of electrical power, at radiofrequency, between a source (here the antenna) and a load (here the low-noise amplifier) is optimum. Impedance matching sensu stricto corresponds to the condition under which the input impedance of the low-noise amplifier, seen by the antenna, is equal to the complex conjugate of the antenna impedance. However, a more general concept of impedance matching will be considered throughout the rest of the text, covering the case in which a compromise is struck between the power transfer, the noise level of the signal at the output of the amplifier and, where appropriate, the electrical consumption of the amplifier.

By "tuning" the impedance-matching network what is meant is modifying its transfer function, and hence its impedance transformation properties.

Figure 1A:
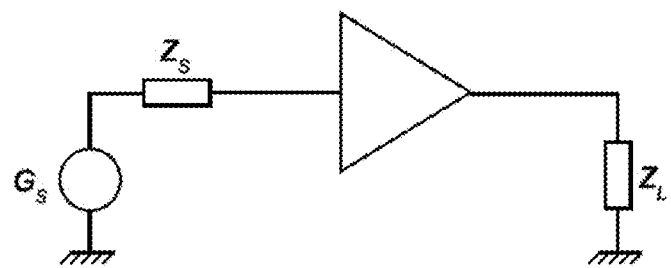
FIGS. 1A to 1G, a computer simulation allowing the technical problem and the principles of the solution provided by the invention to be illustrated.

FIG. 1A illustrates the circuit diagram of a low-noise amplifier LNA designed to operate at 1 GHz and suitable for the implementation of a reception chain according to one embodiment of the invention. The input port of this circuit is connected to a signal generator $G_S$ having a variable complex impedance $Z_S$ which models a reception antenna, of impedance $Z_{ANT}$, connected to an impedance-matching network. Its output port is connected to a load impedance whose value $Z_L$ is, conventionally, 50 ohms.

Figure 1B:
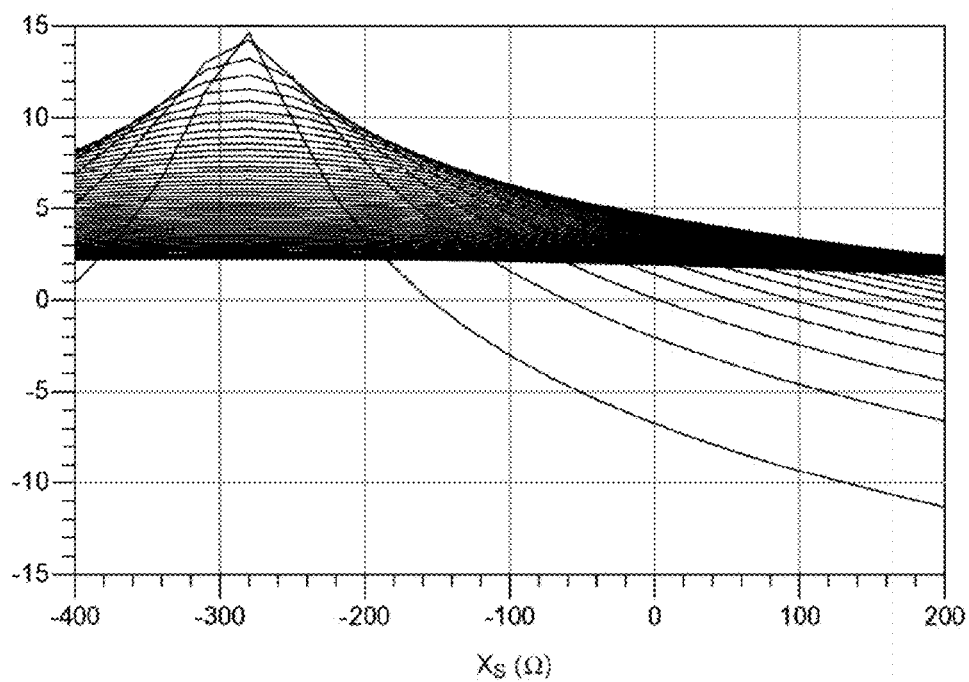
Figure 1C:
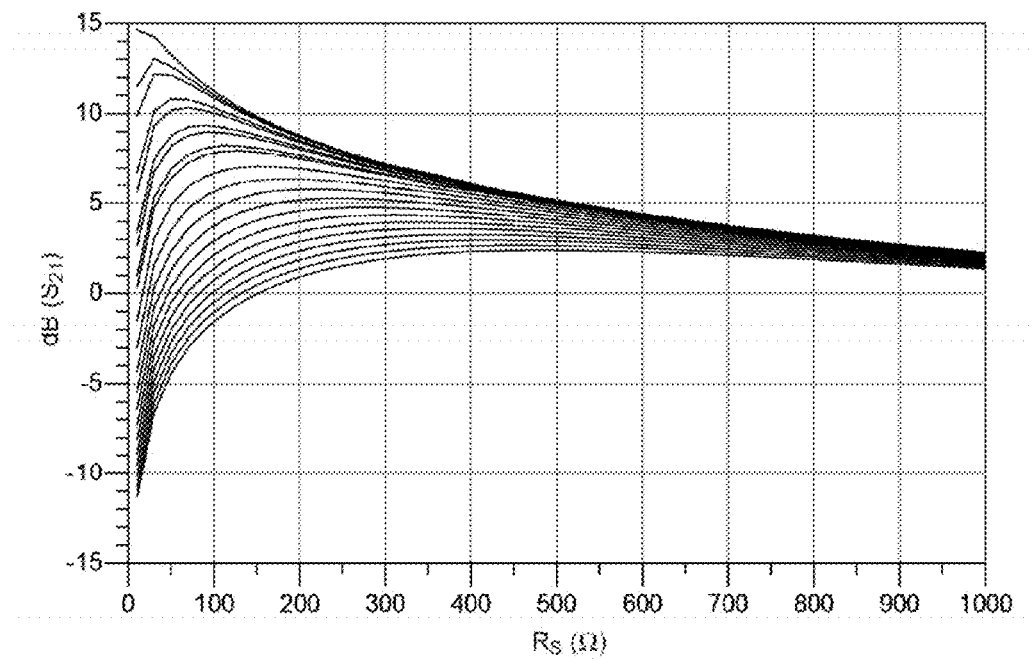
Figure 2:
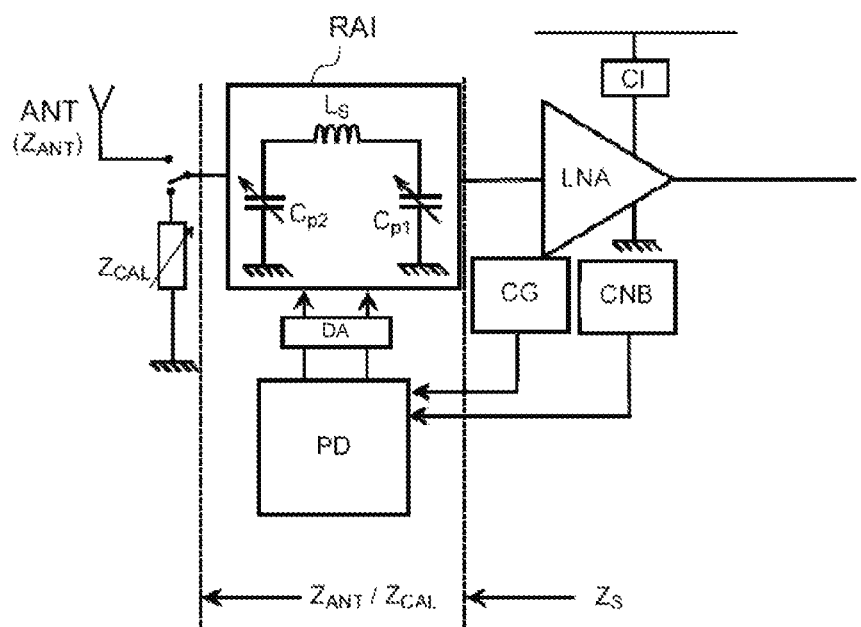
FIG. 2, the diagram of a radiofrequency reception chain according to one embodiment of the invention.

FIG. 1B illustrates the dependency of the gain (in dB) measured between the signal generator and the output of the amplifier, which corresponds to the parameter $S_{21}$ of the S-matrix of the system, on the imaginary (reactive) part $X_S$ of the impedance $Z_S$ for various values—between 0 and 1000Ω—of its real (resistive) part $R_S$. FIG. 1C shows the dependency of the gain on $R_S$ for various values of $X_S$ between −400Ω and 200Ω. It is possible to verify that the gain takes a maximum value for $Z_S$=10-280 jΩ, j being the imaginary unit. In general, the antenna impedance $Z_{ANT}=R_{ANT}+j\,X_{ANT}$ will take a different value, and even a value that is variable over time, hence the need to introduce, between the antenna and the input port of the amplifier, an impedance-matching network. In the diagram of FIG. 2, for example, a reactive circuit with concentrated elements (filter) RAI having a "pi" topology is used, but other types of circuits, with concentrated or distributed parameters, are known to those skilled in the art and are suitable for the implementation of the invention.

Figure 1D:
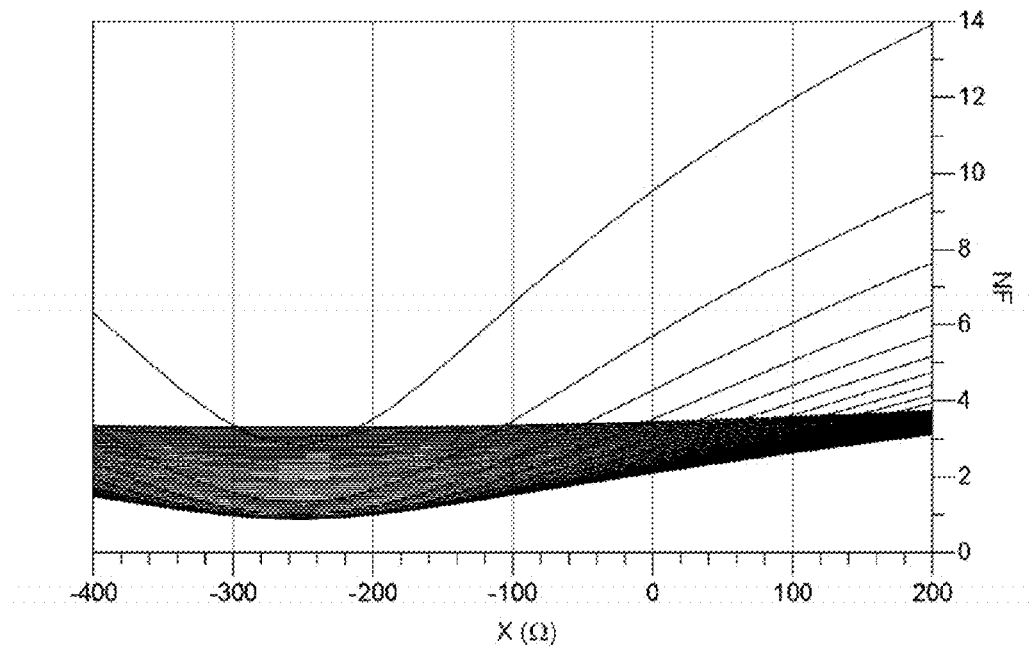
Figure 1E:
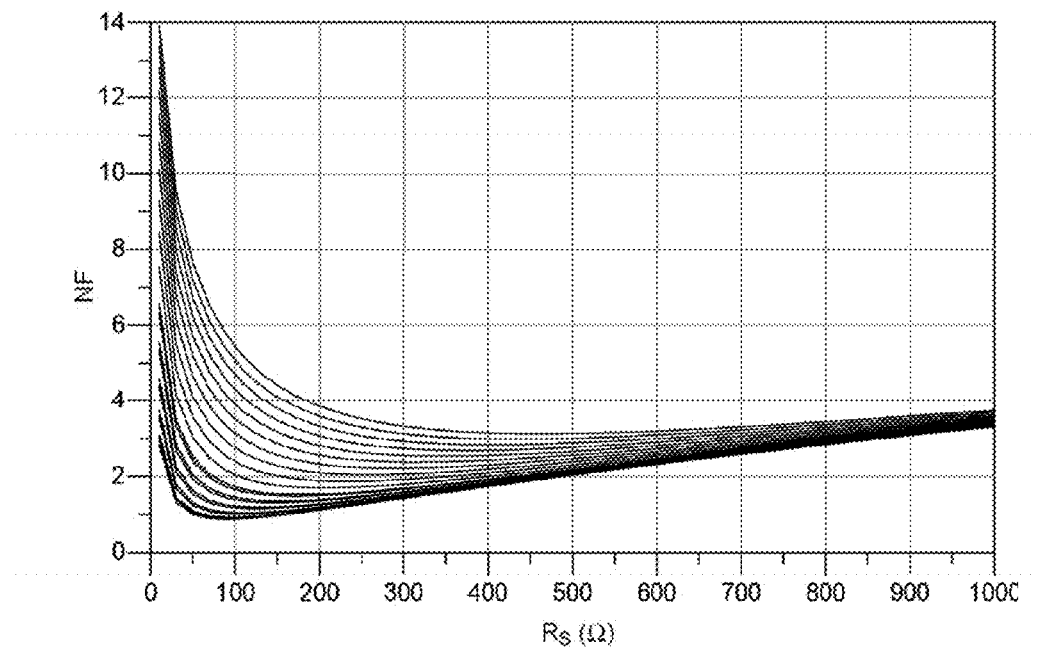

The noise factor NF of the amplifier—which influences the noise level at its output—is also affected by the antenna impedance. FIGS. 1D and 1E illustrate the dependency of NF (shown on a linear scale) on $X_S$ and $R_{qs}$, respectively. It is possible to verify that the noise factor takes a minimum value for $Z_S$=230-250 j$\Omega$.

Figure 1F:
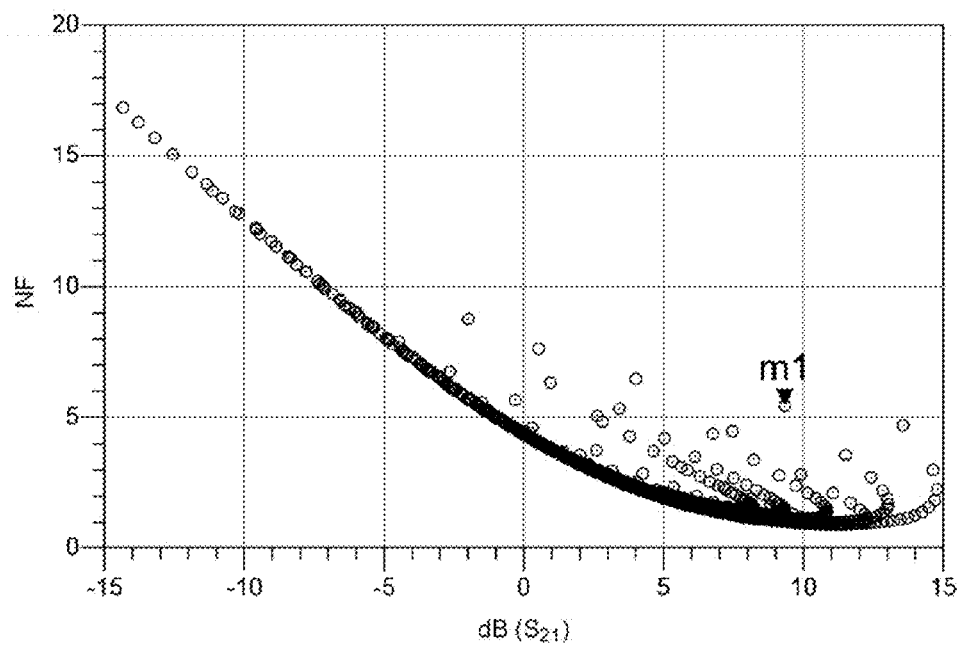

FIG. 1F summarizes these results expressing NF as a function of $S_{21}$ for various values of $Z_S$, where $R_S$ varies between 5 and 1000$\Omega$ and $X_S$ between −200 and 400$\Omega$. This figure confirms that, although it is not possible to minimize NF and maximize $S_{21}$ at the same time, it is nonetheless possible to strike a satisfactory comprise between these two parameters; simultaneous optimization of the gain and of the noise level is then spoken of (the latter being proportional to NF for a determined input signal). In practical terms, this could mean maximizing or minimizing an objective function—for example a linear function—of NF and of $S_{21}$, or else maximizing NF under the constraint of a minimum value of $S_{21}$ (expressed as an absolute value or as a percentage of the maximum possible value), or vice versa.

Figure 1G:
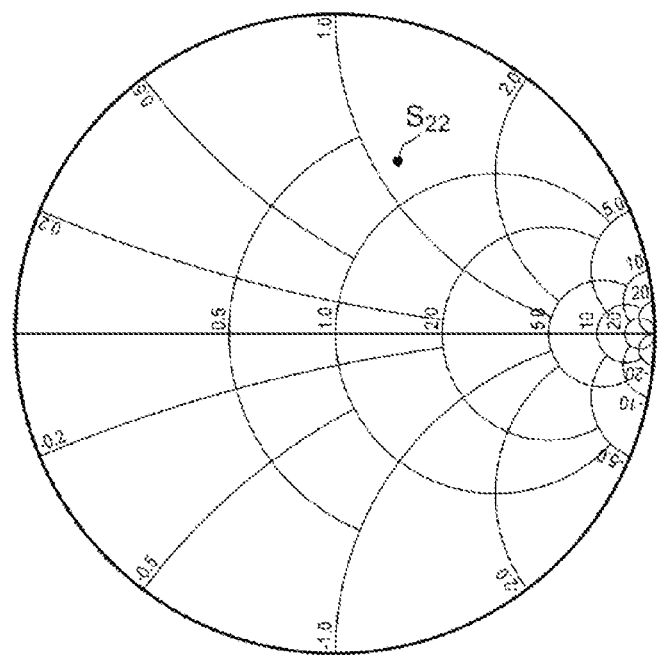

The target value of $Z_S$ allowing this optimum to be reached depends both on the antenna impedance $Z_{ANT}$ and on the transfer function of the impedance-matching network RAI. As the first is variable over time, the second must be modified accordingly. Unfortunately, as mentioned above, it is difficult to determine $Z_{ANT}$ on the basis of measurements taken directly at the antenna output, or even at the input of the amplifier LNA, and it is generally impossible to do so on the basis of measurements taken at the output of the LNA. This last point is illustrated by FIG. 1G, which represents, on a Smith chart, the output impedance $S_{22}$ of the LNA as a function of $Z_S$. This representation is reduced to a point; stated otherwise, the output impedance $S_{22}$ of the LNA is completely independent of the source impedance $Z_S$. This means that the current and voltage measurements taken at the output of the LNA allow only $S_{22}$ to be determined, and do not allow $Z_S$, and hence $Z_{ANT}$, to be obtained.

To overcome this difficulty, the invention proposes to measure, by means of suitable measuring circuits, the noise level SNR and the gain G at the output of the low-noise amplifier LNA, as shown schematically in FIG. 2. A data processor PD processes these measurements according to an algorithm that will be described below and generates signals for controlling a tuning device DA which acts—electrically and/or mechanically—on the reactive elements $C_{P1}$, $C_{P2}$, $L_S$ of the matching network RAI in order to modify their reactance and, consequently, their transfer function, which links the antenna impedance $Z_{ANT}$ to the impedance $Z_S$ seen by the input port of the amplifier LNA and which influences its levels of performance, as shown in FIGS. 1B-1F.

The gain sensor CG may be a simple voltage sensor connected to the output of the amplifier LNA. Specifically, this output voltage—for example its root-mean-square (RMS) value—may be considered to be representative of the gain of the amplifier.

Producing a noise level sensor CNB is trickier. It is possible, for example, to measure the output root-mean-square voltage of the LNA when its input is connected to a matched impedance, in the absence of a signal (which may be carried out automatically by providing such an impedance connected to the input via a controlled switch), but this disrupts the normal operation of the reception chain. In the case in which the reception chain supplies a digital signal acquisition chain, it is possible to measure—inside the latter—the bit error rate (BER), this measurement being made possible through the use of channel coding, on the basis of which, knowing the modulation type used, it is possible to obtain the signal-to-noise ratio (SNR) at the end of the chain. Next, the signal-to-noise ratio at the output of the LNA, and hence the noise factor of the latter, may be determined through application of the Friis formula for noise. Additionally, the information on the signal-to-noise ratio, obtained by measuring the BER, and that on the noise factor, allow the gain of the LNA to be obtained, assuming that the gain of the other elements of the chain is known.

The noise level may also be estimated by delivering a known calibration signal, for example a pure sinusoid, as input to the LNA and by comparing this calibration signal to the amplified signal. For example, a single-frequency calibration signal will have regularly spaced zero crossings (spacing equal to half a period). In contrast, in the signal amplified by the LNA, the phase noise introduces random deviations in the periodicity of the zero crossings. The amplitude of these deviations may be measured and quantifies the noise factor.

More generally, any technique for estimating noise level known to those skilled in the art could be used for the implementation of the invention.

The data processor PD is typically a suitably programmed microprocessor, but it may also be a hardware-configured digital circuit, or a combination of the two.

The tuning device DA may comprise voltage generators allowing the capacitance of variable-capacitance diodes to be varied and current generators allowing the inductance of reactors having a saturable core to be varied; likewise voltage-controlled inductors and tunable inductors of microelectromechanical system (MEMS) type also exist, see for example:

Casha, O.; Grech, I.; Micallef, J.; Gatt, E.; Morche, D.; Viala, B.; Michel, J. P.; Vincent, P.; de Foucauld, E.: "Utilization of MEMS Tunable Inductors in the design of RF voltage-controlled oscillators", 15th IEEE International Conference on Electronics, Circuits and Systems, 2008. ICECS 2008;

L. Collot, J. Lintignat, B. Viala, D. Morche, J-P. Michel, B. Barelaud, B. Jarry "Reconfigurable Filtering Differential Low Noise Amplifier Using MEMS Tunable Inductor" Proceedings of the 40th European Microwave Conference, 2010, pages: 826-829.

The tuning device DA may also comprise switches allowing reactive elements to be connected or disconnected, and/or the topology of the matching network to be modified.

Figure 3A:
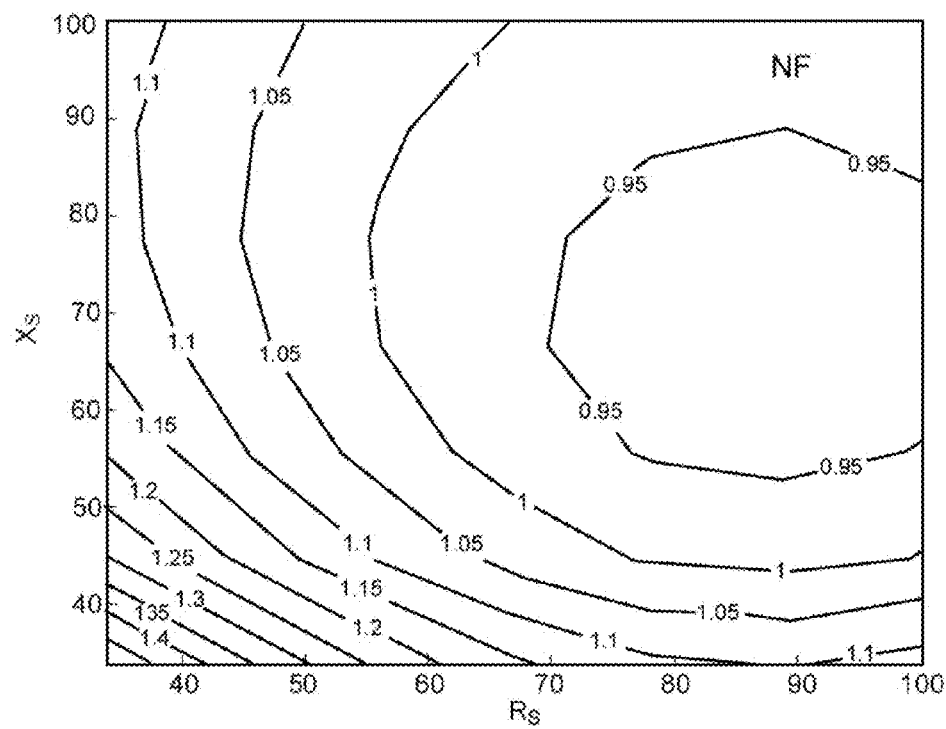
FIGS. 3A, 3B and 3C, curves of the noise factor and of the gain of the reception chain of FIG. 2 as a function of the real part and of the imaginary part of the antenna impedance.
Figure 3B:
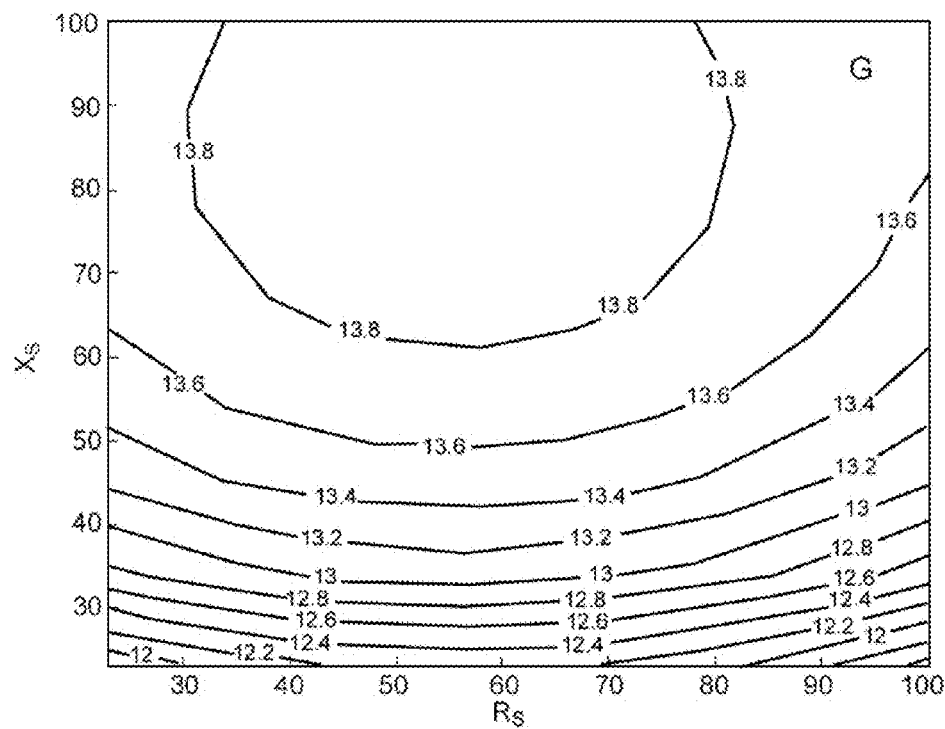
Figure 3C:
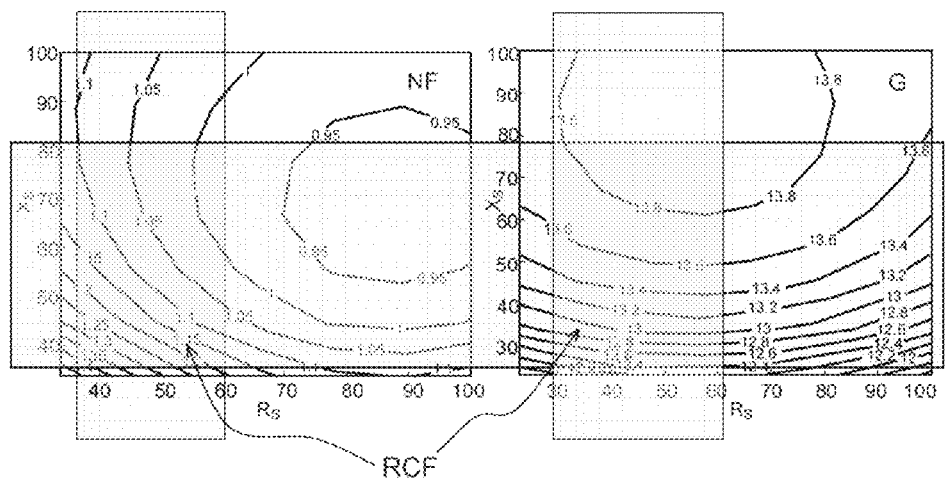
Figure 3D:
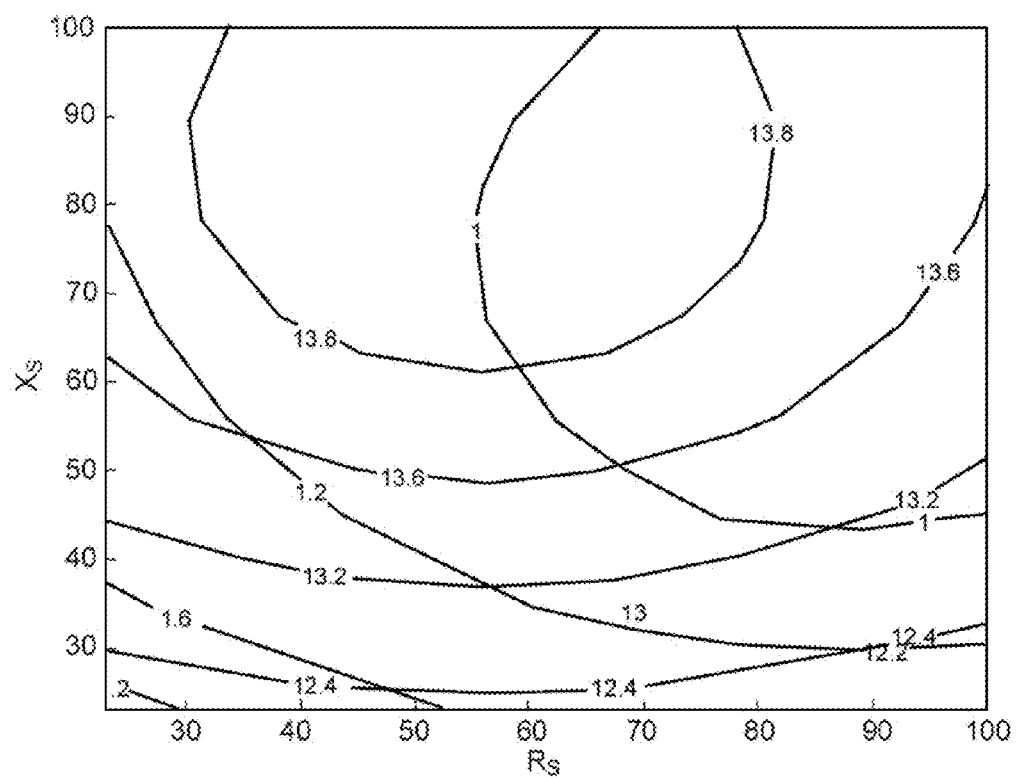
FIG. 3D is a superposition of FIGS. 3A and 3B.

FIGS. 3A and 3B show curves of noise factor NF and gain G level, respectively, as a function of the impedance $Z_S$ seen from the input port of the amplifier LNA. However, in practice, the real and imaginary parts of the antenna impedance $Z_{ANT}$, and hence also of $Z_S$, may vary only within limited ranges. Thus, only the regions denoted by the reference symbol RCF in FIG. 3C correspond to operating conditions that are liable to be encountered in the normal operation of the reception chain. In most cases, if consideration is limited to these operational regions, it is possible to define a bijective relationship between (NF, G) and the complex impedance $Z_S$; this is illustrated by FIG. 3D, in which the curves of FIGS. 3A and 3B have been superposed; it is possible to verify that, for a complex impedance value, there is only one crossing of the curves of NF and G level. Stated otherwise, measuring the gain and the noise level allows the value of the input impedance $Z_S$ to be obtained; to do this, the data processor PD may simply use a lookup table established in a prior calibration phase.

On the basis of the value of $Z_S$ thus determined, the data processor PD may, assuming that the transfer function of the matching network RAI is known, calculate the antenna impedance $Z_{ANT}$.

Once $Z_{ANT}$ is known, the data processor PD may determine the tuning of the matching network RAI allowing impedance matching sensu stricto, as defined above, to be obtained.

Figure 4:
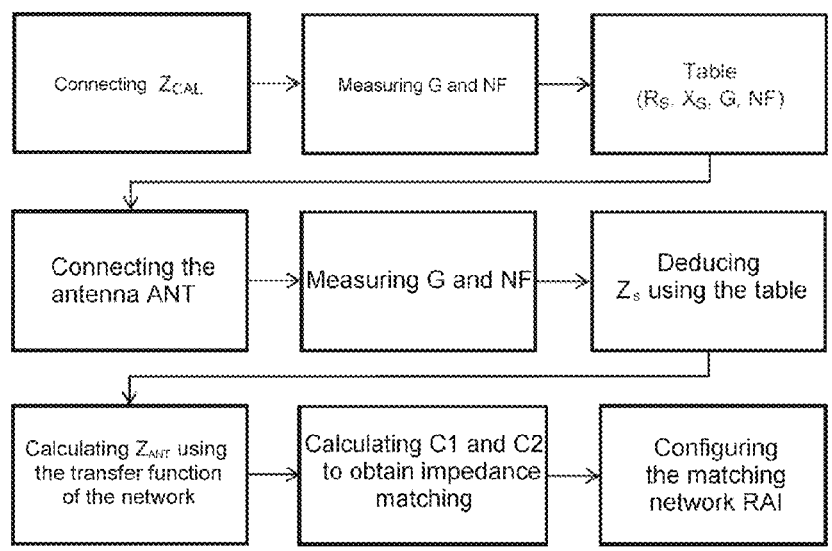
FIG. 4, the flowchart of an impedance-matching method according to one embodiment of the invention.

The process is illustrated by the flowchart of FIG. 4.

Firstly, a variable calibration impedance $Z_{CAL}$ is connected to the input of the reception chain, instead of the antenna. The value of $Z_{CAL}$ is made to vary in a controlled manner, while the configuration, and hence the tuning, of the impedance-matching network ZAI is kept constant (it is even possible to disconnect and bypass this network). The gain G and the noise factor NF are measured, or deduced from voltage and SNR measurements. This allows a lookup table linking (G, NF) to the real and imaginary parts $R_{CAL}$, $X_{CAL}$ of the calibration impedance to be constructed.

Then the antenna ANT, having an unknown impedance $Z_{ANT}$ which varies over time in an uncontrolled manner, is connected in place of the calibration impedance; in FIG. 2, a switch makes it possible to selectively connect the antenna or the variable calibration impedance. The gain G and the noise factor NF are measured again, these measurements being repeated at regular intervals or when a deterioration in the performance levels of the chain is observed (expressed, for example, by an increase in the bit error rate). Through application of the lookup table calculated in the calibration phase, the processor PD determines the value $Z_S$ of the impedance seen from the input port of the LNA, which depends on $Z_{ANT}$ (unknown) and on the transfer function of the matching network RAI (known). Next, calculations whose principles are well known allow the value of $Z_{ANT}$, then the values of the reactances of the network RAI, to be determined, allowing impedance matching to be performed (for example $C_{P1}$ and $C_{P2}$, assuming that $L_S$ is invariable). The processor PD then generates the appropriate control signals for controlling the tuning device DA, so that the impedance matching is actually performed.

In the (unlikely) event that multiple values of $Z_S$ would lead to one and the same pair (gain, noise level), it would be sufficient to test the corresponding configurations of the impedance-matching network and to choose that which maximizes the gain and/or minimizes the noise level.

Furthermore, it is possible that, in certain cases, multiple separate configurations of the network RAI (i.e. multiple sets of values of its reactances) allow impedance matching to be obtained. In this case, it is advantageous to choose the configuration that minimizes the consumption of the LNA. It may be found by testing the various configurations and measuring, for each thereof, the supply current of the LNA (current sensor CI shown in FIG. 2), or through the use of a table set up through prior calibration.

The invention claimed is:

1. An automatic impedance-matching method for a radiofrequency reception chain comprising: an antenna, an amplifier and a configurable impedance-matching network arranged between said antenna and an input of said amplifier, the method comprising the following steps:
    a) acquiring measurement of a gain of the reception chain and of a noise level at an output of the amplifier; and
    b) tuning said impedance-matching network according to said measurements;
    wherein said step b) comprises the following sub-steps:
        b1) determining an impedance seen from the input of the amplifier on a basis of the measurements from step a);
        b2) calculating an impedance of the antenna on a basis of the impedance determined in the preceding sub-step and of a transfer function of the impedance-matching network; and
        b3) tuning said impedance-matching network so as to perform impedance matching between the antenna and the amplifier.

2. The method according to claim 1, wherein said sub-step b1) is implemented through application of a lookup table.

3. The method according to claim 1, wherein said step a) comprises measuring a bit error rate of a digital signal received by said radiofrequency reception chain, and calculating said noise level at the output of the amplifier according to the bit error rate.

4. The method according to claim 1, wherein said step b3) comprises determining a plurality of configurations of the impedance-matching network allowing said impedance matching to be performed, choosing, from among these configurations, that which minimizes a consumption of the amplifier, and configuring the impedance-matching network according to the chosen configuration.

5. A radiofrequency reception chain comprising: an antenna, an amplifier and a configurable impedance-matching network, arranged between said antenna and an input of said amplifier, further comprising:
    circuits for measuring a gain of the reception chain and a noise level at an output of the amplifier;
    a tuning device for tuning said impedance-matching network; and
    a data processor configured to receive, as input, the gain and the noise-level measurements originating from said measuring circuits and to deliver, as output, signals for controlling said tuning device;
    wherein said data processor is configured to:
        determine an impedance seen from the input of the amplifier on a basis of the measurements originating from said measuring circuits;
        calculate an impedance of the antenna on a basis of the impedance thus determined and of a transfer function of the impedance-matching network; and
        deliver, as output, signals for controlling said tuning device,
    which signals are capable of performing impedance matching between the antenna and the amplifier.

6. The radiofrequency reception chain according to claim 5, wherein said data processor is configured to determine said impedance seen from the input of the amplifier through application of a lookup table.

7. The radiofrequency reception chain according to claim 5, wherein said circuit for measuring the noise level at the output of the amplifier is configured to measure a bit error rate of a digital signal received by said radiofrequency reception chain, and to calculate said noise level according to the bit error rate.

8. The radiofrequency reception chain according to claim 5, wherein said data processor is also configured to determine a plurality of configurations of the impedance-matching network allowing said impedance matching to be performed, to choose, from among these configurations, that which minimizes a consumption of the amplifier, and to deliver, as output, signals for controlling said tuning device corresponding to the chosen configuration.

\* \* \* \* \*